United States Patent
Snowdon et al.

(10) Patent No.: US 7,008,862 B2
(45) Date of Patent: Mar. 7, 2006

(54) REGULAR ARRAY OF MICROSCOPIC STRUCTURES ON A SUBSTRATE AND DEVICES INCORPORATING SAME

(75) Inventors: Kenneth James Snowdon, Northumberland (GB); Matthias Marcus Batzill, New Orleans, LA (US); François Bardou, Bischoffsheim (FR)

(73) Assignee: Ever 1391 Limited (GB)

( * ) Notice: Subject to any disclaimer, the term of this patent is extended or adjusted under 35 U.S.C. 154(b) by 188 days.

(21) Appl. No.: 10/714,252

(22) Filed: Nov. 14, 2003

(65) Prior Publication Data

US 2004/0171235 A1 Sep. 2, 2004

Related U.S. Application Data

(63) Continuation-in-part of application No. 10/168,239, filed as application No. PCT/GB01/00222 on Jan. 23, 2001, now Pat. No. 6,649,491.

(30) Foreign Application Priority Data

Jan. 25, 2000 (GB) .............................................. 0001518

(51) Int. Cl.
*H01L 29/47* (2006.01)

(52) U.S. Cl. ....................................... 438/473; 438/798
(58) Field of Classification Search .................. 438/473
See application file for complete search history.

(56) References Cited

U.S. PATENT DOCUMENTS

| | | | |
|---|---|---|---|
| 4,490,783 A | | 12/1984 | McDonough et al. |
| 4,807,218 A | * | 2/1989 | Gerber .......................... 369/100 |
| 5,155,826 A | | 10/1992 | Fadem |
| 6,128,214 A | | 10/2000 | Kuekes et al. |
| 6,248,674 B1 | | 6/2001 | Kamins et al. |
| 6,314,019 B1 | | 11/2001 | Kuekes et al. |

FOREIGN PATENT DOCUMENTS

WO    PCT/GB01/00222    6/2001

OTHER PUBLICATIONS

Batzill, M., et al., "Preferential Sputtering Induced Stress Domains and Mesoscopic Phase Separation on $CaF_2(111)$," *Physical Review Letters*, vol. 85, No. 4, pp. 780–783, (Jul. 24, 2000).

Facsko, S., et al.; "Formation of Ordered Nanoscale Semiconductor Dots by Ion Sputtering," *Science*, vol. 285, pp. 1551–1553, (Sep. 3, 1999).

Wissing, M., et al., "An Apparatus for Glancing Incidence Ion Beam Polishing and Characterization of Surfaces to Angstrom–Scale Root–Mean–Square Roughness," *Rev. Sci. Instrum.*, vol. 67, No. 12, pp. 4314–4320, (Dec. 1996).

* cited by examiner

*Primary Examiner*—David Nelms
*Assistant Examiner*—Thao P. Le
(74) *Attorney, Agent, or Firm*—Daniel B. Schein, Esq.

(57) ABSTRACT

A regular array and method of forming a substantially regular array of microscopic structures on a surface of a sample is described. A device of the present invention comprises a microscopic layer of at least one first material on a substrate of a second material, wherein the microscopic layer is sufficiently thin that stress fields at the interface of the microscopic layer and the substrate cause formation of separated regions of the first material on the substrate. The microscopic layer on the sample is irradiated by means of a particle beam at an acute angle to influence the direction of alignment of the separated regions and/or the relative position of adjacent the separated regions.

24 Claims, 2 Drawing Sheets

REGULAR ARRAY OF MICROSCOPIC STRUCTURES ON A SUBSTRATE AND DEVICES INCORPORATING SAME

PRIORITY

This application is a Continuation-In-Part of U.S. patent application Ser. No. 10/168,239, filed Jun. 17, 2002, now U.S. Pat. No. 6,649,491 which claims priority of Patent Cooperation Treaty application number PCt/GB01/00222, filed Jan. 23, 2001, which claims priority of United Kingdom Patent Application 0001518.0 filed Jan. 25, 2000.

BACKGROUND

The present application relates to a device having a substantially regular array of microscopic structures on a substrate and a method of making such an array. The application relates particularly, but not exclusively, to formation of nanometer sized wire-like structures on a substrate.

Patterned surface structures on articles have applications in the fabrication of various devices, for example data storage media, microelectronic and microelectromechanical devices, sensors, optoelectronic display devices, and other optical and optoelectronic components such as optical components for directing atomic beams, as well as applications in tissue engineering and for cell adhesion or non-adhesion, or for guiding motion or growth of cells, liquids or molecules, or in molecular scale filters. Known patterning processes involve optical lithography processes or direct-write patterning techniques such as electron beam lithography and scanning probe methods.

However, optical lithography processes suffer from the drawback that they are of limited resolution, and direct-write patterning techniques, although capable of achieving higher lateral resolution than optical lithography, are impracticable for use in mass production applications because the serial nature of the surface modification process is inherently slow. Also, when applied to larger areas of material, for example more than a few square centimeters, such processes suffer poor large scale dimensional accuracy, and in the case of patterning formed by step and scan techniques, poor registration between separate write operations and scanned regions is achieved.

BRIEF SUMMARY

The above disadvantages and more may be overcome by the different embodiments disclosed here. One advantage of the present embodiments is that the surface layer from which the structures are to be formed can be formed at substantially the same time as the formation of the substantially regular array of structures, by carrying out both using the same particle beam or beams.

The method may further comprise adjusting the direction of at least a first particle beam relative to the surface layer.

This provides the advantage of enabling the nature and/or formation of the substantially regular array of structures to be adjusted.

The adjustment may comprise rotating the surface layer relative to at least one of the particle beams.

The method may further comprise moving at least the first particle beam relative to the surface layer.

The moving of the first particle beam may comprise scanning the beam across the surface layer, or moving the surface layer relative to the first particle beam.

The method may further comprise mounting the substrate to an grounded support.

This provides an advantage in that under certain circumstances at least one particle beam may impact on the grounded support, which may result in at least partial neutralization of electrostatic charge building up on the surface layer or on the substrate.

The method may further comprise stabilizing the substantially regular array of structures.

In another embodiment, an array of structures on a substrate comprises a surface layer of a first material on the substrate, the substrate formed of a second material, wherein the structures are substantially regular, the surface layer is sufficiently thin such that stress fields at an interface of the surface layer and the substrate cause formation of separated regions of the first material on the substrate, and at least one of a direction of alignment of the separated regions and a relative position of adjacent separated regions is dependent on at least one particle beam directed onto the surface layer at an acute angle thereto.

The structures may be approximately 2 atoms in height and/or approximately 10 nm in separation. The array of structures may further comprise at least one protective coating disposed on the at least one surface layer. The surface layer may be disposed on a crystal plane of the substrate. For example, the surface layer may be disposed on a (111) crystal plane of the substrate.

A plurality of layers may be disposed on the substrate. Each layer may be formed from the first material and/or comprise structures that are substantially regular and substantially linear, or substantially linear rows of dot-like structures. The structures of adjacent layers may be disposed at angles to each other, for example adjacent layers may be at right angles to each other or other angles, for example 120 degrees. The structures of at least two of the adjacent layers may be arranged directly on each other or at least one intermediate layer may exist between the structures of at least two of the adjacent layers.

Gaps in the surface layer may be filled by at least one of at least one gaseous material adsorbed into the gaps and material that has been deposited into the gaps. The at least one surface layer may have an area larger than a few square centimeters. The at least one surface layer may contain a third material deposited on the at least one surface layer from a source other than a source from which the first material is deposited.

The first material may be calcium or calcium-rich or a semiconductor, insulator or another metal. The second material may be calcium fluoride or a semiconductor, insulator or metal.

A high density memory device may comprise the array of structures. For example, a computer or image capture device may include a high density memory device of the present invention. Electronic filters, optical devices, communications devices such as mobile telephones, automobiles and home appliances are additional non-limiting embodiments of devices that may also incorporate the present inventions.

In another embodiment, an array of structures on a substrate comprises at least one surface layer containing at least a first material on the substrate, the substrate formed of a second material, wherein the structures are substantially regular and substantially linear, or substantially linear rows of dot-like structures, the first material is formed in separated regions, and the first material contains one of a metal or a semiconductor. For example, the first material may comprise calcium.

The structures may be approximately 2 atoms in height and/or approximately 10 nm in separation, ranging up to approximately 10 atoms in height and/or 50 nm in separation. The first material may comprise a metal, be metal-rich, or comprise a semiconductor. For example, the first material may comprise calcium or be calcium rich. The second material may be calcium fluoride or an insulator or semiconductor. The surface layer may be disposed on a crystal plane of the substrate, for example the (111) crystal plane of a substrate.

A plurality of layers may be disposed on the substrate. Each layer of the plurality of layers may be formed from the first material and/or comprise structures that are substantially regular and linear. The structures of adjacent layers may be disposed at right angles to each other. The structures of at least two of the adjacent layers may be arranged directly on each other or at least one intermediate layer may exist between the structures of at least two of the adjacent layers.

Gaps in the surface layer may be filled by at least one of at least one gaseous material adsorbed into the gaps and material that has been deposited into the gaps. The at least one surface layer may have an area larger than a few square centimeters. The at least one surface layer may contain a third material deposited on the at least one surface layer from a source other than a source from which the first material is deposited. The array may further comprise at least one protective coating disposed on the at least one surface layer.

In another embodiment, a surface patterning apparatus comprises a vacuum chamber, at least a first particle source disposed within the vacuum chamber, and a rotatable support disposed within the vacuum chamber and that has a large enough area to enable a substrate to be attached thereto. The first particle source is disposed at an acute angle with respect to the support and the angle and a type and energy of particles from a particle beam of the at least the first particle source are selected such that structures of a surface layer formed on the substrate are substantially regular, the surface layer is sufficiently thin such that stress fields at an interface of the surface layer and the substrate cause formation of separated regions on the substrate, and at least one of a direction of alignment of the separated regions and a relative position of adjacent separated regions is dependent on the angle of the first particle source.

The surface patterning apparatus may further comprise a motor to rotate the support. The surface patterning apparatus may further comprise a second particle source disposed within the vacuum chamber such that particles in a particle beam from the second particle source impinge on the substrate. Particles from the second particle source may be different from the particles from the first particle source. The second particle source may be disposed at a different angle than the first particle source. The second particle source may be disposed approximately perpendicular to the support. The first particle source and the second particle source may be disposed such that material from the first particle source and the second particle source are deposited at the same time. The first particle source and the second particle source may be disposed such that material from the first particle source and the second particle source are deposited independently from one another. The first particle source may be disposed at an angle of approximately 10° with respect to the support. The particles from the first particle source may be argon ions. The argon ions may have a kinetic energy of approximately 4,500 eV.

A vacuum in the vacuum chamber may be approximately $4 \times 10^{-8}$ mbar. The support may be grounded. The first particle source may deposit calcium, calcium-rich material, another metal, or a semiconductor on the substrate. The first particle source may deposit material on the substrate sufficient to form structures that are generally parallel to a projection of an axis of the particle beam on the substrate.

In another embodiment a substantially regular array of structures on a substrate is formed by a method comprising providing a surface layer of a first material on a substrate of a second material, wherein the surface layer is sufficiently thin that stress fields at an interface of the surface layer and the substrate cause formation of separated regions of the first material on the substrate, and directing at least a first particle beam onto the surface layer and at a respective acute angle thereto to influence at least one of a direction of alignment of the separated regions and a relative position of adjacent separated regions.

The providing the surface layer may comprise depositing the surface layer on the substrate. The surface layer may be deposited using at least a second particle beam. The providing the surface layer may comprise modifying the surface of the substrate using at least one particle beam. The surface of the substrate may be modified using at least the first particle beam. The method may comprise adjusting a direction of at least the first particle beam relative to the surface layer. The adjusting may comprise rotating the surface layer relative to at least the first particle beam. The method may further comprise moving at least the first particle beam relative to the surface layer. The moving may comprise scanning at least the first beam across the surface layer or moving the surface layer relative to at least the first particle beam.

The method may further comprise mounting the substrate to a grounded support.

The method may further comprise stabilizing the substantially regular array of structures. The stabilization may include application of at least one protective coating. The stabilization may include chemical modification of the substantially regular array of structures.

The method may further comprise at least partially filling at least some gaps between the adjacent structures of the substantially regular array. The filling may comprise adsorbing at least one gaseous material into the gaps and/or depositing material into the gaps.

The method may further comprise directing at least two first particle beams onto the surface layer, wherein the at least two first particle beams are not parallel to each other.

The method may further comprise the forming of a plurality of the substantially regular arrays of structures. The plurality of substantially regular arrays of structures may be arranged in separate layers.

DETAILED DESCRIPTION

Figure 1:
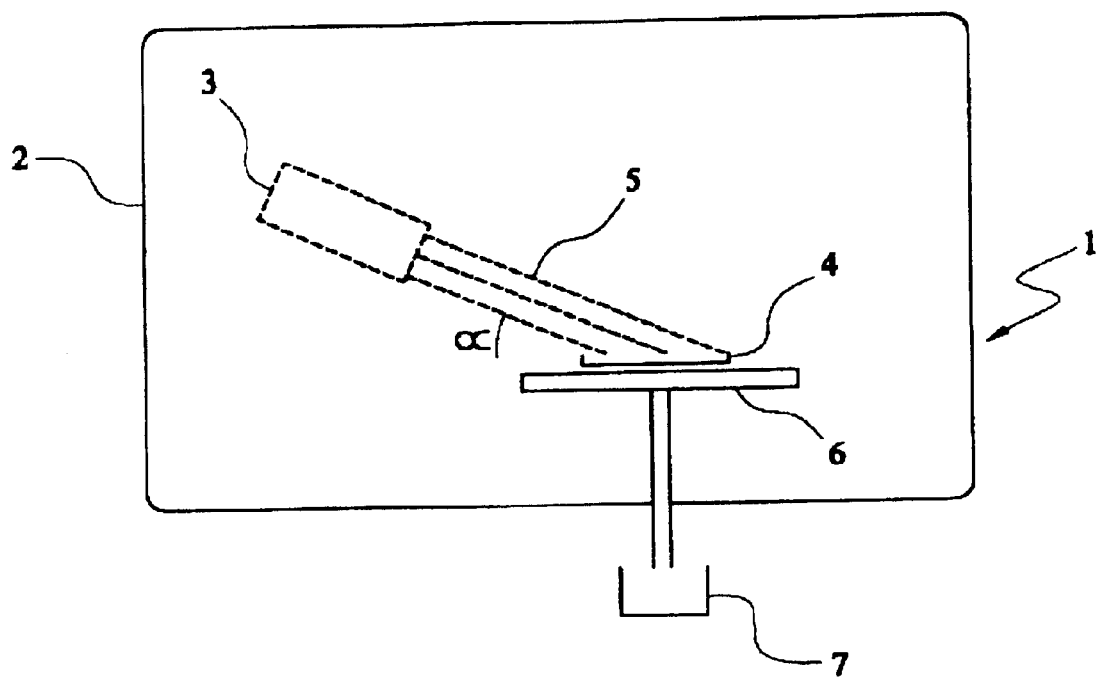
FIG. 1 is a schematic view of an apparatus for carrying out a process of a first embodiment.

Referring to FIG. 1, a surface patterning apparatus 1 for forming nanometer sized structures of calcium or calcium-rich material on the surface of a substrate of calcium fluoride comprises a vacuum chamber 2 containing a particle beam source 3 for irradiating a sample 4. The particle beam source 3 directs a particle beam 5 at an angle α onto sample 4, which is mounted to a support 6 such as a grounded aluminum support. The support 6 can be rotated by means of a suitable device 7 such as a motor, the purpose of which will be described in greater detail below.

The operation of the apparatus 1 shown in FIG. 1 will now be described by means of the following example.

EXAMPLE

A sample 4 of calcium fluoride was produced by cleaving a calcium fluoride crystal in air at room temperature and pressure, by striking the crystal with a sharp instrument along a direction that generally coincided with the intersection of a (111) crystal plane with one of the crystal surfaces. The freshly cleaved sample 4 was then placed in the vacuum chamber 2 which was evacuated to a pressure of approximately $4 \times 10^{-8}$ mbar, and the major residual gas components of which were hydrogen and water vapor. Introduction of the sample 4 into the vacuum chamber 2 was assisted by the use for sample introduction of an intermediate small vacuum chamber (not shown) that could be rapidly evacuated to a pressure of approximately $10^{-3}$ mbar.

Figure 2:
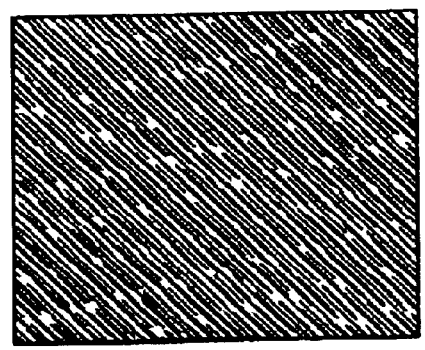
FIG. 2 is the surface of a structure formed using the apparatus of FIG. 1.

The sample 4 was mounted to a support 6 comprising an electrically grounded aluminum plate, and was irradiated under an angle of incidence α of approximately 10° to the sample surface by a beam 5 of singly positively charged argon ions having a kinetic energy per incident ion of approximately 4,500 electron volts (eV). The sample 4 was held fixed relative to the support 6. The sample 4 as shown in FIG. 2 was removed from the vacuum chamber 2 and examined by means of a commercially available atomic force microscope, equipped with ultra sharp silicon probe tips supplied by NT-MDT Co. Moscow, having a nominal tip end radius of less than 10 nm. Examination of the sample 4 revealed arrays of linear structures which were always found to be generally parallel to the projection of the axis of the ion beam 5 on the sample surface 4, and to be approximately two atoms in height and approximately 10 nm in separation.

The method described with reference to FIG. 1 can, under certain circumstances, also be used to form multiple layers of such structures by means of sequentially carrying out the method of FIG. 1 described above. For example, the formation of superimposed layers of wire-like structures (arranged directly or indirectly on top of each other) generally at right angles to each other could be used to construct high density memory devices or optical devices or electronic filter devices.

Figure 3:
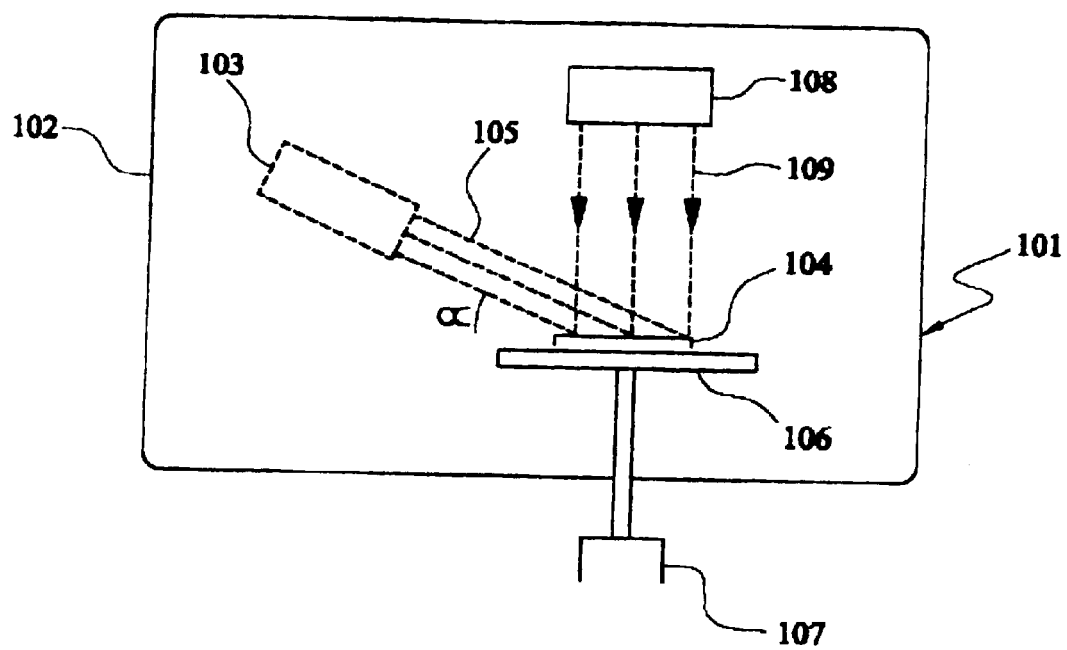
FIG. 3 is a schematic view of an apparatus for carrying out a process of a second embodiment.

Referring now to FIG. 3, in which parts common to the embodiment of FIG. 1 are denoted by like reference numerals but increased by 100, a surface patterning apparatus 101 for carrying out a method of a second embodiment of the invention also includes within vacuum chamber 102 a second beam source 108, being a source of atoms, molecules or clusters which are deposited on the surface of sample 104 by means of a second beam 109. This allows material to be deposited on the surface of sample 104 at the same time as, or independently of, irradiation of the sample 104 by means of the first ion beam 105. In the case of the apparatus 101 of FIG. 3 being used in connection with materials where the stress field between the surface layer and the substrate would tend to cause the formation of compact, non-elongated regions of the material forming the surface layer, for example semiconducting materials, by rotating the sample 104 relative to the ion beam, it is possible to create a substantially regular lattice of dot-like structures. For example, stress fields at the interface can lead on their own to spontaneous formation of either elongated (wire-like) structures or compact (dot-like) structures. A particle beam incident at a small angle to the surface plane can effectively 'comb' the wire-like structures to become straighter, less branched, and acquire more regular widths and separations. A particle beam can also be used in the same way to align dot-like structures in rows. Use of two (or more) such beams incident from different directions (e.g. at right angles or at 120 degrees to each other) can assist the formation of regular 2 dimensional arrays of such dots (e.g. 2 beams at right angles or one beam rotated repeatedly between two dwell positions produce a 'square' array of dots, 3 beams or one beam rotated between three dwell positions 120 degrees to each other produce a hexagonal array of dots It is therefore intended that the foregoing detailed description be regarded as illustrative rather than limiting, and that it be understood that it is the following claims, including all equivalents, that are intended to define the spirit and scope of this invention.

What is claimed is:

1. A device comprising an array of structures on a substrate, wherein: said array of structures is formed from a first surface layer comprising a first material, and said substrate comprises a second material, said first surface layer being sufficiently thin that stress fields at the interface of said surface layer and said substrate caused formation of separated regions of said first material on said substrate wherein said first surface layer comprises separated regions forming at least two structures, said at least two structures being each about 2 atoms to about 10 atoms in height and being separated from each other by about 10 nm to about 50 nm, wherein the direction of alignment of said separated regions and/or the relative position of adjacent said separated regions has been influenced by directing at least one first particle beam onto said surface layer and at a respective acute angle thereto.

2. The device of claim 1, wherein said first surface layer is disposed on a crystal plane of said substrate.

3. The device of claim 1, wherein plural layers are disposed on said substrate, said first surface layer being one of said plural layers.

4. The device of claim 3, wherein each of said plural layers comprises said first material.

5. The device of claim 4, wherein each of said plural layers comprises structures which are substantially regular and substantially linear, or substantially linear rows of dot-like structures.

6. The device of claim 5, wherein said structures in at least two adjacent of said plural layers are disposed substantially at right angles to each other, or aligned in rows substantially at right angles to each other or substantially at 120 degrees to each other.

7. The device of claim 6, wherein said structures in at least two adjacent of said plural layers are arranged directly on each other.

8. The device of claim 3, wherein at least one intermediate layer exists between said structures of at least two adjacent of said plural layers.

9. The device of claim 1, wherein gaps in said first surface layer between said at least two structures are filled by at least one adsorbed gaseous material and material that has been deposited into the gaps.

10. The device of claim 1, wherein at least said first surface layer has an area larger than a few square centimeters.

11. The device of claim 1, wherein at least said first surface layer comprises a third material deposited thereon from a source other than a source from which the first material is deposited.

12. The device of claim 1, wherein sold first material comprises calcium.

13. The device of claim 1, wherein said second material comprises calcium fluoride.

14. The device of claim 12, wherein said second material comprises calcium fluoride, and wherein said substrate comprises at least one (111) crystal plane surface, and at least a portion of said first surface layer is on at least one of said at least one (111) crystal plane surface.

15. The device of claim 1, wherein said first material comprises a semiconductor or a metal or an insulator.

16. A data storage device, comprising the device of claim 1.

17. An optoelectronic device, comprising the device of claim 1.

18. An electronic device, comprising the device of claim 1.

19. An electromechanical device, comprising the device of claim 1.

20. A device comprising an array of structures on a substrate, wherein: said array of structures is formed from a first surface layer comprising a first material, said substrate comprises a second material having at least one crystal plane surface, wherein at least a portion of said first surface layer is on at least one of said at least one crystal surface, said first surface layer being sufficiently thin that stress fields at the interface of said surface layer and said substrate caused formation of separated regions of said first material on said substrate wherein said first surface layer comprises separated regions forming at least two structures, said first material comprises at least one substance selected from the group consisting of a metal, and a semiconductor, wherein said at least two structures are aligned and regularly spaced.

21. The device of claim 20, wherein said second material comprises calcium fluoride.

22. The device of claim 20, wherein said at least two structures comprise nanowires each about 2 atoms in height, wherein said at least two structures are separated from each other by about 10 nm.

23. The device of claim 21, wherein said at least two structures are each about 2 atoms in height, wherein said at least two structures are separated from each other by about 10 nm.

24. The device of claim 23, wherein said substrate comprises at least one (111) crystal plans surface, and at least a portion of said first surface layer is on at least one of said at least one (111) crystal plane surface.

* * * * *